United States Patent
Wu et al.

(10) Patent No.: US 10,319,452 B2
(45) Date of Patent: Jun. 11, 2019

(54) SHIFT REGISTER UNITS AND DRIVING METHODS, GATE DRIVING CIRCUITS AND TOUCH DISPLAY DEVICES

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Bo Wu, Beijing (CN); Wen Tan, Beijing (CN)

(73) Assignees: BOE TECHNOLOGY GROUP CO., LTD., Beijing (CN); CHENGDU BOE OTOELECTRONICS TECHNOLOGY CO., LTD., Chengdu, Sichuan Province (CN)

(*) Notice: Subject to any disclaimer, the term of this patent is extended or adjusted under 35 U.S.C. 154(b) by 121 days.

(21) Appl. No.: 15/513,154

(22) PCT Filed: Sep. 20, 2016

(86) PCT No.: PCT/CN2016/099445
§ 371 (c)(1),
(2) Date: Mar. 21, 2017

(87) PCT Pub. No.: WO2017/121144
PCT Pub. Date: Jul. 20, 2017

(65) Prior Publication Data
US 2018/0329547 A1    Nov. 15, 2018

(30) Foreign Application Priority Data
Jan. 13, 2016 (CN) .......................... 2016 1 0022155

(51) Int. Cl.
*G11C 19/28* (2006.01)
*G06F 3/041* (2006.01)
*G09G 3/20* (2006.01)

(52) U.S. Cl.
CPC ............ *G11C 19/28* (2013.01); *G06F 3/0416* (2013.01); *G09G 3/20* (2013.01)

(58) Field of Classification Search
CPC ............ G09G 2310/0286; G11C 19/28; G11C 19/287
See application file for complete search history.

(56) References Cited

U.S. PATENT DOCUMENTS

2007/0164973 A1* 7/2007 Tobita .................. G09G 3/3648
345/100
2010/0026669 A1* 2/2010 Lee ...................... G09G 3/3677
345/204

(Continued)

FOREIGN PATENT DOCUMENTS

CN        1750073 A        3/2006
CN        101030361 A      9/2007

(Continued)

OTHER PUBLICATIONS

International Search Report and Written Opinion dated Dec. 22, 2016, for PCT Patent Application No. PCT/US2016/099445.

(Continued)

*Primary Examiner* — Sanjiv D. Patel
(74) *Attorney, Agent, or Firm* — Kinney & Lange, P.A.

(57) ABSTRACT

The present disclosure provides a shift register unit comprising a first signal input terminal, a second signal input terminal, an input and reset module, a pull-up module, a pull-down module, a pull-down control module, a clock signal input terminal, a first level input terminal, a second level input terminal, a first voltage terminal, a second voltage terminal, a signal output terminal, a discharge mod- (Continued)

ule and a current leakage suppression module. The present disclosure further provides a gate driving circuit, a touch display device, and a method for driving a shift register unit. A phenomenon of dark lines does not occur during display on the touch display device.

20 Claims, 4 Drawing Sheets

(56) References Cited

U.S. PATENT DOCUMENTS

| | | | | |
|---|---|---|---|---|
| 2011/0193853 | A1* | 8/2011 | Sakamoto | G09G 3/3677 345/213 |
| 2014/0103983 | A1* | 4/2014 | Chang | G09G 3/3655 327/198 |
| 2014/0118237 | A1* | 5/2014 | Wang | G11C 19/28 345/100 |
| 2015/0346904 | A1* | 12/2015 | Long | G09G 3/3677 345/174 |
| 2015/0365085 | A1* | 12/2015 | Qing | H03K 17/302 345/100 |
| 2015/0371716 | A1* | 12/2015 | Shao | G11C 19/287 345/100 |

FOREIGN PATENT DOCUMENTS

| | | |
|---|---|---|
| CN | 103021360 A | 4/2013 |
| CN | 103996370 A | 8/2014 |
| CN | 104091572 A | 10/2014 |
| CN | 104809973 A | 7/2015 |
| CN | 105702294 A | 6/2016 |
| WO | 2010061657 A1 | 6/2010 |

OTHER PUBLICATIONS

International Search Report and Written Opinion dated Dec. 22, 2016, for PCT Patent Application No. PCT/CN2016/099445.
First Chinese Office Action dated Feb. 28, 2019, received for corresponding Chinese Application No. 201610022155.4.

* cited by examiner

SHIFT REGISTER UNITS AND DRIVING METHODS, GATE DRIVING CIRCUITS AND TOUCH DISPLAY DEVICES

CROSS-REFERENCE TO RELATED APPLICATION(S)

The present disclosure claims priority to the Chinese Patent Application No. 201610022155.4, filed on Jan. 13, 2016, which is incorporated herein by reference in its entirety.

TECHNICAL FIELD

The present disclosure relates to the field of display technology, and more particularly, to shift register units and driving methods thereof, gate driving circuits, and touch display devices comprising the gate driving circuit.

BACKGROUND

At present, touch display panels have become the mainstream display terminal configurations, and capacitive touch screens have an absolute dominant position. In order to reduce a cell gap, the capacitive touch screens enable integration of a touch panel and a display panel using In Cell solutions.

Generally, a touch display device is driven using a time-division driving method for display. Time-division driving refers to a method for alternately displaying and touching in one frame picture time. In order to improve the touch effect when an embedded touch screen is fabricated using an array substrate having a gate driving circuit, one frame time of the display device is divided into a plurality of alternate display phases and touch phases, so as to improve a report rate of the touch. In a touch phase, driving of display is paused, and a first node of a stage of shift register unit where the pausing occurs is always at a high level after pre-charging of a previous stage. As a discharge module connected to the first node has inherent leakage current, in a touch scan phase, current leakage may occur to the first node through the discharge module, and the first node cannot be maintained in a high level state. In a display recovery phase, a voltage of the first node (for example, a pull-up node) of this stage of shift register unit is lower than a voltage of a first node of another stage, which causes a voltage of a signal output from a gate driving circuit of this stage to be lower than that of another stage, and there will be a dark line during display. In the entire touch display process, the display phase and the touch phase may be paused alternately many times, and there may be many dark lines on a display screen, thereby resulting in degradation of the display effect or even failure in display.

Therefore, how to avoid the dark lines during display becomes a technical problem to be solved in the art.

SUMMARY

The present disclosure aims to provide a shift register unit, a gate driving circuit, a touch display device comprising the gate driving circuit and a method for driving a shift register unit. There are no dark lines during display on the touch display device.

In order to achieve the above purpose, in an aspect of the present disclosure, there is provided a shift register unit applied in a touch display device, comprising: a first signal input terminal, a second signal input terminal, an input and reset module, a pull-up module, a pull-down module, a pull-down control module, a clock signal input terminal, a first level input terminal, a second level input terminal, a first voltage terminal, a second voltage terminal, a signal output terminal, a discharge module and a current leakage suppression module, wherein the input and reset module has a first control terminal connected to the first signal input terminal, a second control terminal connected to the second signal input terminal, a first input terminal connected to the first voltage terminal, a second input terminal connected to the second voltage terminal, and an output terminal connected to the first node, wherein when the first signal input terminal receives a valid voltage signal and the second signal input terminal receives an invalid voltage signal, a connection between the first voltage terminal and the output terminal of the input and reset module is turned on, and when the first signal input terminal receives an invalid voltage signal and the second signal input terminal receives a valid voltage signal, a connection between the second voltage terminal and the output terminal of the input and reset module is turned on;

the pull-up module has an input terminal connected to the clock signal input terminal, an output terminal connected to the signal output terminal, and a control terminal connected to the first node, wherein when the control terminal of the pull-up module receives a valid voltage signal from the first node, a connection between the input terminal of the pull-up module and the signal output terminal is turned on;

the pull-down module has an input terminal connected to the second level input terminal, an output terminal connected to the signal output terminal, and a control terminal connected to the second node, wherein when the control terminal of the pull-down module receives a valid voltage signal from the second node, a connection between the input terminal of the pull-down module and the output terminal of the pull-down module is turned on;

the pull-down control module has a control terminal connected to the first node, an output terminal connected to the second node, a first input terminal connected to the first level input terminal, and a second input terminal connected to the second level input terminal, wherein when the control terminal of the pull-down control module receives a valid voltage signal, a connection between the second level input terminal and the output terminal of the pull-down control module is turned on, and when the control terminal of the pull-down control module receives an invalid voltage signal, a connection between the first level input terminal and the output terminal of the pull-down control module is turned on;

the discharge module has an output terminal connected to the first node, a control terminal connected to the second node, and an input terminal connected to an output terminal of the current leakage suppression module, wherein when the control terminal of the discharge module receives a valid voltage signal, a connection between the input terminal of the discharge module and the output terminal of the discharge module is turned on; and the current leakage suppression module is capable of supplying a valid voltage signal to the input terminal of the discharge module when an invalid voltage signal is received by the control terminal of the discharge module, and the current leakage suppression module is capable of supplying an invalid voltage signal to the input terminal of the discharge module when a valid voltage signal is received by the control terminal of the discharge module.

Preferably, the discharge module comprises a discharge transistor having a gate formed as the control terminal of the discharge module, a first electrode formed as the output terminal of the discharge module, and a second electrode formed as the input terminal of the discharge module.

Preferably, the current leakage suppression module comprises a first current leakage suppression transistor having a gate connected to the first voltage terminal, a first electrode formed as the output terminal of the current leakage suppression module, and a second electrode connected to the second voltage terminal.

Preferably, the current leakage suppression module further comprises a second current leakage suppression transistor having a gate connected to the second voltage terminal, a first electrode connected to the input terminal of the discharge module, and a second electrode connected to the first voltage terminal.

Preferably, the pull-up module comprises a pull-up transistor and a storage capacitor, wherein the pull-up transistor has a gate formed as the control terminal of the pull-up module, a first electrode formed as the input terminal of the pull-up module, and a second electrode formed as the output terminal of the pull-up module, and the storage capacitor has a first terminal connected to the first node, and a second terminal connected to the output terminal of the pull-up module.

Preferably, the pull-down module comprises a pull-down transistor having a gate formed as the control terminal of the pull-down module, a first electrode formed as the output terminal of the pull-down module, and a second electrode formed as the input terminal of the pull-down module.

Preferably, the pull-down control module comprises a first control transistor, a second control transistor, a third control transistor and a fourth control transistor, wherein the first control transistor has a gate and a first electrode connected to the first level input terminal, and a second electrode connected to a gate of the second control transistor, the second control transistor has a first electrode connected to the first level input terminal, and a second electrode formed as the control terminal of the pull-down control module, the third control transistor has a gate formed as the output terminal of the pull-down control module, a first electrode connected to the second electrode of the first control transistor, and a second electrode connected to the second level input terminal, and the fourth control transistor has a gate connected to the first node, a first electrode connected to the second node, and a second electrode connected to the second level input terminal.

Preferably, the reset and input module comprises a first reset and input transistor and a second reset and input transistor, wherein the first reset and input transistor has a gate connected to the first signal input terminal, a first electrode connected to the first voltage terminal, and a second electrode connected to the first node, and the second reset and input transistor has a gate connected to the second signal input terminal, a first electrode connected to the first node, and a second electrode connected to the second voltage terminal.

In another aspect of the present disclosure, there is provided a gate driving circuit, comprising multiple cascaded stages of shift register units, wherein an operating period of the gate driving circuit comprises alternate display phases and touch phases, and the multiple stages of shift register units are divided into a plurality of groups, each of which comprises N shift register units and corresponds to one of the display phases, where N is a natural number, wherein at least starting from a second group of shift register units, at least a first stage of shift register unit in each of the groups of shift register units is the shift register unit according to the present disclosure.

In another aspect of the present disclosure, there is provided a touch display device comprising a gate driving circuit and a touch driving circuit including a plurality of output terminals, wherein the gate driving circuit is the gate driving circuit according to the present disclosure, and the plurality of output terminals of the touch driving circuit are divided into a plurality of groups, each of which comprises M output terminals and corresponds to one of the touch phases, where M is a natural number.

In a further aspect of the present disclosure, there is provided a method for driving shift register units comprising the shift register unit according to the present disclosure. When a forward scan is performed, the method comprises, in each driving period:

in a charge phase, supplying a valid voltage signal to the first signal input terminal, supplying an invalid voltage signal to the second signal input terminal, supplying a valid voltage signal to the first voltage terminal, supplying an invalid voltage signal to the second voltage terminal, and supplying an invalid voltage signal to the clock signal input terminal;

in a touch phase, supplying an invalid voltage signal to the first signal input terminal, supplying an invalid voltage signal to the second signal input terminal, supplying a valid voltage signal to the first voltage terminal, supplying a valid voltage signal to the second voltage terminal, and supplying an invalid voltage signal to the clock signal input terminal;

in an output phase, supplying an invalid voltage signal to the first signal input terminal, supplying an invalid voltage signal to the second signal input terminal, supplying a valid voltage signal to the first voltage terminal, supplying an invalid voltage signal to the second voltage terminal, and supplying a valid voltage signal to the clock signal input terminal; and in an output pull-down phase, supplying a valid voltage signal to the second signal input terminal, supplying an invalid voltage signal to the first signal input terminal, supplying a valid voltage signal to the first voltage terminal, supplying an invalid voltage signal to the second voltage terminal, and supplying an invalid voltage signal to the clock signal input terminal; or when a reverse scan is performed, the method comprises, in each driving period:

in a charge phase, supplying an invalid voltage signal to the first signal input terminal, supplying a valid voltage signal to the second signal input terminal, supplying an invalid voltage signal to the first voltage terminal, supplying a valid voltage signal to the second voltage terminal, and supplying an invalid voltage signal to the clock signal input terminal;

in a touch phase, supplying an invalid voltage signal to the first signal input terminal, supplying an invalid voltage signal to the second signal input terminal, supplying a valid voltage signal to the first voltage terminal, supplying a valid voltage signal to the second voltage terminal, and supplying an invalid voltage signal to the clock signal input terminal;

in an output phase, supplying an invalid voltage signal to the first signal input terminal, supplying an invalid voltage signal to the second signal input terminal, supplying an invalid voltage signal to the first voltage terminal, supplying a valid voltage signal to the second voltage terminal, and supplying a valid voltage signal to the clock signal input terminal; and in an output pull-down phase, supplying a valid voltage signal to the first signal input terminal, supplying an invalid voltage signal to the second signal input terminal, supplying an invalid voltage signal to the first voltage terminal, supplying a valid voltage signal to the second voltage terminal, and supplying an invalid voltage signal to the clock signal input terminal.

In the present disclosure, the current leakage suppression module supplies a valid signal to the discharge module in the touch phase, and the valid signal is transmitted to the first node. Therefore, current leakage does not occur to the first node through the discharge module in the touch phase, and thereby it can ensure that the first node can be maintained at a high level in the output phase after the touch phase and it can further ensure a normal output in the output phase, so that it can avoid defects such as occurrence of dark lines during display on the display device comprising the shift register unit etc.

BRIEF DESCRIPTION OF THE DRAWINGS

The accompanying drawings are intended to provide a further understanding of the disclosure and constitute a part of the specification. The accompanying drawings are used to explain the present disclosure together with the detailed description below, but are not to be construed as limiting the disclosure. In the accompanying drawings.

DETAILED DESCRIPTION

Specific implementations of the present disclosure will be described in detail below with reference to the accompanying drawings. It is to be understood that the specific implementations described here are for the purpose of illustration and explanation of the present disclosure only and are not intended to limit the present disclosure.

Figure 1:
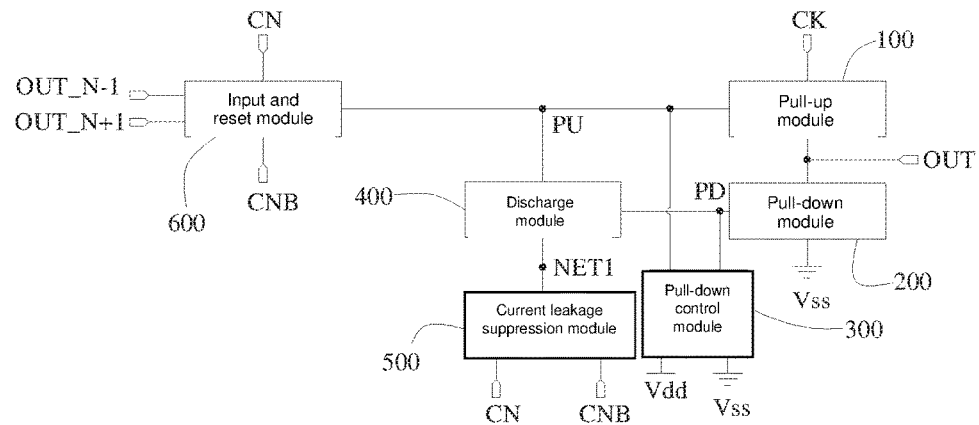
FIG. 1 is a structural diagram of a shift register unit according to the present disclosure.

In an aspect of the present disclosure, there is provided a shift register unit applied in a touch display device. Each operating period of the shift register unit comprises a charge phase, a touch phase, an output phase and an output pull-down phase. As shown in FIG. 1, the shift register unit comprises a first signal input terminal OUT_N−1, a second signal input terminal OUT_N+1, an input and reset module 600, a pull-up module 100, a pull-down module 200, a clock signal input terminal CK, a first level input terminal Vdd, a second level input terminal Vss, a first voltage terminal CN, a second voltage terminal CNB, a signal output terminal OUT, a discharge module 400, a current leakage suppression module 500 and a pull-down control module 300.

As shown in FIG. 1, the input and reset module 600 has a first control terminal connected to the first signal input terminal OUT_N−1, a second control terminal connected to the second signal input terminal OUT_N+1, a first input terminal connected to the first voltage terminal CN, a second input terminal connected to the second voltage terminal CNB, and an output terminal connected to the first node PU. When the first signal input terminal OUT_N−1 receives a valid voltage signal and the second signal input terminal OUT_N+1 receives an invalid voltage signal, a connection between the first voltage terminal CN and the output terminal of the input and reset module 600 is turned on, and when the first signal input terminal OUT_N−1 receives an invalid voltage signal and the second signal input terminal OUT_N+1 receives a valid voltage signal, a connection between the second voltage terminal CNB and the output terminal of the input and reset module 600 is turned on.

The first voltage terminal CN and the second voltage terminal CNB supply a valid voltage signal or an invalid voltage signal as required, and how to select voltage signals supplied by the first voltage terminal CN and the second voltage terminal CNB will be described below in conjunction with an operation principle of the shift register unit according to the present disclosure.

The pull-up module 100 has an input terminal connected to the clock signal input terminal CK, an output terminal connected to the signal output terminal OUT, and a control terminal connected to the first node PU. When the control terminal of the pull-up module 100 receives a valid voltage signal from the first node PU, a connection between the input terminal of the pull-up module 100 and the signal output terminal OUT is turned on.

The pull-down module 200 has an input terminal connected to the second level input terminal Vss, an output terminal connected to the signal output terminal OUT, and a control terminal connected to the second node PD. When the control terminal of the pull-down module 200 receives a valid voltage signal from the second node PD, a connection between the input terminal of the pull-down module 200 and the output terminal of the pull-down module 200 is turned on.

The pull-down control module 300 has a control terminal connected to the first node PU, an output terminal connected to the second node PD, a first input terminal connected to the first level input terminal Vdd, and a second input terminal connected to the second level input terminal Vss. When the control terminal of the pull-down control module 300 receives a valid voltage signal, a connection between the second level input terminal Vss and the output terminal of the pull-down control module 300 is turned on, and when the control terminal of the pull-down control module 300 receives an invalid voltage signal, a connection between the first level input terminal Vdd and the output terminal of the pull-down control module 300 is turned on.

The discharge module 400 has an output terminal connected to the first node PU, a control terminal connected to the second node PD, and an input terminal connected to an output terminal of the current leakage suppression module 500 at a connection point NET1. When the control terminal of the discharge module 400 receives a valid voltage signal, a connection between the input terminal of the discharge module 400 and the output terminal of the discharge module 400 is turned on.

The current leakage suppression module 500 can supply a valid voltage signal to the input terminal of the discharge module 400 when an invalid voltage signal is received by the control terminal of the discharge module 400, and the current leakage suppression module 500 can supply an invalid voltage signal to the input terminal of the discharge module 400 when a valid voltage signal is received by the control terminal of the discharge module 400.

By setting the current leakage suppression module 500, it can ensure that the first node PU is maintained at a high level in the output phase and it can further ensure a normal output in the output phase, so that it can avoid defects such as occurrence of dark lines during display on the display device comprising the shift register unit etc.

The shift register unit according to the present disclosure is used in a gate driving circuit, and the gate driving circuit is used in a touch display device. The gate driving circuit comprising the shift register unit is used to supply a scan signal to the touch display device.

In the shift register unit according to the present disclosure, one of the first signal input terminal OUT_N−1 and the second signal input terminal OUT_N+1 is used as a control signal input terminal of the shift register unit and the other is used as a reset signal input terminal of the shift register unit.

When only a forward scan can be performed in the display device, the first signal input terminal OUT_N−1 is the control signal input terminal and the second signal input terminal OUT_N+1 is the reset signal input terminal. In this case, the first voltage terminal CN supplies a valid voltage signal, and the second voltage terminal CNB supplies an invalid voltage signal in the charge phase, the output phase, and the output pull-down phase.

When only a reverse scan can be performed in the display device, the first signal input terminal OUT_N−1 is the reset signal input terminal and the second signal input terminal OUT_N+1 is the control signal input terminal. In this case, the first voltage terminal CN supplies an invalid voltage signal in the charge phase, the output phase and the output pull-down phase, and the second voltage terminal CNB supplies a valid voltage signal. The first level input terminal Vdd supplies a valid voltage signal at least in each sub-stage of the display phase, and the second level input terminal Vss always supplies an invalid voltage signal.

When a bidirectional scan can be performed in the display device, during a forward scan, the first signal input terminal OUT_N−1 is the control signal input terminal, the second signal input terminal OUT_N+1 is the reset signal input terminal, the first voltage terminal CN supplies a valid voltage signal, and the second voltage terminal CNB supplies an invalid voltage signal in the charge phase, the output phase and the output pull-down phase; and during a reverse scan, the first signal input terminal OUT_N−1 is the reset signal input terminal, the second signal input terminal OUT_N+1 is the control signal input terminal, the first voltage terminal CN supplies an invalid voltage signal in the charge phase, the output phase and the output pull-down phase, and the second voltage terminal CNB supplies a valid voltage signal.

As the input terminal of the pull-up module 100 is connected to the clock signal input terminal CK, the valid voltage signal output from the shift register unit in the output phase is input from the clock signal input terminal CK.

As described above, the shift register unit according to the present disclosure is used in a touch display device. One frame time of the display device comprises a display phase and a touch phase. The charge phase, the output phase, and the output pull-down phase in the operating period of the shift register unit belong to sub-phases of the display phase. It can be seen that in the display device used in the present disclosure, the touch phase runs through the respective sub-phases of the display phase. In the touch phase, a touch driving signal and a touch sensing signal are supplied to the display device, and there is no output from the output terminal of the shift register unit.

The operation principle of the shift register unit will be described below with reference to the method for driving a display device according to the present disclosure.

Figure 3:
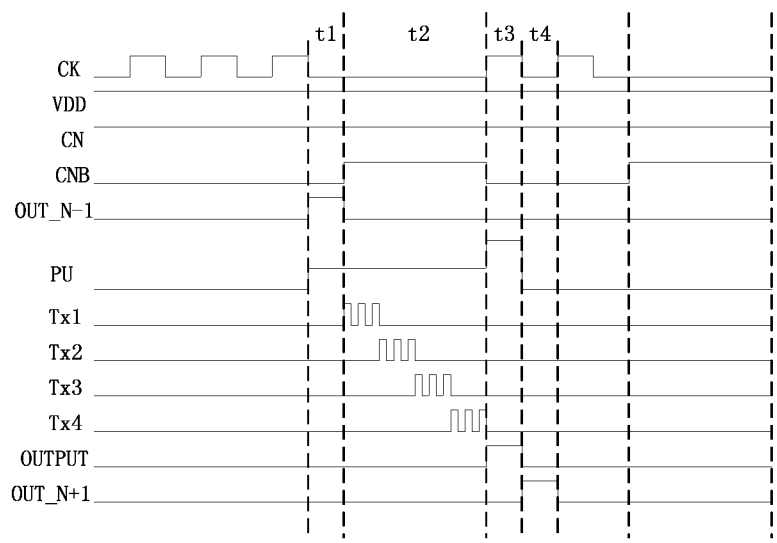
FIG. 3 is a timing diagram of signals during a forward scan of the shift register unit provided in FIG. 2.

FIG. 3 is a timing diagram of various signals when a forward scan is performed. Each operating period of the driving method comprises the following phases.

In a charge phase t1, a valid voltage signal is supplied to the first signal input terminal OUT_N−1, an invalid voltage signal is supplied to the second signal input terminal OUT_N+1, a valid voltage signal is supplied to the first voltage terminal CN, an invalid voltage signal is supplied to the second voltage terminal CNB, and an invalid voltage signal is supplied to the clock signal input terminal CK. In this phase, a connection between the first voltage terminal CN and the output terminal of the input and reset module 600 is turned on, so as to charge the first node PU with a valid voltage signal supplied from the first voltage terminal CN. As the first node PU receives a valid voltage signal at this time, the pull-down control module 300 outputs an invalid voltage signal to the second node PD. As an invalid voltage signal is input from the clock signal input terminal CK, the signal output terminal OUT outputs an invalid voltage signal in the charge phase t1. At the same time, the control terminal of the discharge module 400 receives an invalid voltage signal from the second node PD, thereby a connection between the input terminal and the output terminal of the discharge module 400 is turned off, and therefore there is no impact on a potential of the first node PU. As the control terminal of the discharge module 400 receives an invalid voltage signal at this time, the current leakage suppression module 500 supplies a valid voltage signal to the input terminal of the discharge module 400. If there is a phenomenon of current leakage between the input terminal and the output terminal of the discharge module 400, the valid voltage signal supplied from the current leakage suppression module 500 is transmitted to the output terminal (i.e., the first node PU) of the discharge module 400, and therefore there is no impact on the potential of the first node PU.

In the touch phase t2, an invalid voltage signal is supplied to the first signal input terminal OUT_N−1, an invalid voltage signal is supplied to the second signal input terminal OUT_N+1, a valid voltage signal is supplied to the first voltage terminal CN, a valid voltage signal is supplied to the second voltage terminal CNB, and an invalid voltage signal is supplied to the clock signal input terminal CK. In the shift register unit, the potential of the first node PU is maintained at the level in the charge phase t1. Therefore, the pull-down control module 300 outputs an invalid voltage signal to the second node PD. As an invalid voltage signal is input from the clock signal input terminal CK, the signal output terminal OUT outputs an invalid voltage signal in the touch phase t2. At the same time, the control terminal of the discharge module 400 receives an invalid voltage signal from the second node PD, thereby a connection between the input terminal and the output terminal of the discharge module 400 is turned off, and therefore there is no impact on the potential of the first node PU. As the control terminal of the discharge module 400 receives an invalid voltage signal at this time, the current leakage suppression module 500 supplies a valid voltage signal to the input terminal of the discharge module. If there is a phenomenon of current leakage between the input terminal and the output terminal of the discharge module 400, the valid voltage signal supplied from the current leakage suppression module 500 is transmitted to the output terminal (i.e., the first node PU) of the discharge module 400, so that there is no impact on the potential of the first node PU. In the touch phase t2, touch driving signal lines are scanned by the touch driving circuit. In an implementation illustrated in FIG. 3, touch driving signal lines Tx1, Tx2, Tx3 and Tx4 are shown.

In the output phase t3, an invalid voltage signal is supplied to the first signal input terminal OUT_N−1, an invalid voltage signal is supplied to the second signal input terminal OUT_N+1, a valid voltage signal is supplied to the first voltage terminal CN, an invalid voltage signal is supplied to the second voltage terminal CNB, and a valid voltage signal is supplied to the clock signal input terminal CK. In the shift register unit, in the output phase t3, the valid voltage signal of the first node PU can be maintained, so that a connection between the input terminal of the pull-up module 100 and the signal output terminal OUT can be turned on, so as to output a valid voltage signal input from the clock signal input terminal CK. In this phase, the control terminal of the pull-down control module 300 receives a valid voltage signal, and therefore a connection between the second level input terminal Vss and the output terminal of the pull-down control module 300 is turned on, so as to maintain an invalid level state of the second node PD. Therefore, a connection between the input terminal and the output terminal of the pull-down module 200 is turned off, so as not to affect a normal output of the shift register unit.

In the output pull-down phase t4, a valid voltage signal is supplied to the second signal input terminal OUT_N+1, an invalid voltage signal is supplied to the first signal input terminal OUT_N−1, a valid voltage signal is supplied to the first voltage terminal CN, an invalid voltage signal is supplied to the second voltage terminal CNB, and an invalid voltage signal is supplied to the clock signal input terminal CK. In this phase, as a valid voltage signal is supplied from the second signal input terminal OUT_N+1, a connection between the output terminal of the input and reset module 600 and the second voltage terminal CNB is turned on, and accordingly, a connection between the output terminal of the pull-down control module 300 and the first level input terminal Vdd is turned on. As a valid voltage signal is supplied from the first level input terminal Vdd, the second node PD receives a valid voltage signal, and thereby a connection between the input terminal and the output terminal of the pull-down module 200 can be controlled to be turned on, so that the signal output terminal OUT outputs an invalid voltage signal. At the same time, as the second node PD receives a valid voltage signal, a connection between the input terminal and the output terminal of the discharge module 400 is turned on. In this phase, the current leakage suppression module 500 supplies an invalid voltage signal to the input terminal of the discharge module 400 to discharge the first node PU.

An operation principle during a reverse scan is similar to that during the forward scan, and will not be described here.

As described above, in an operation process of the shift register unit according to the present disclosure, the touch phase is prior to the output phase, and in the touch phase, the current leakage suppression module 500 supplies a valid voltage signal to the input terminal of the discharge module 400. Therefore, even if current leakage occurs to the discharge module 400 in the touch phase, there is no impact on the potential of the first node PU, and thereby it can ensure that the valid voltage signal of the first node is maintained in the output phase and it can further ensure a normal output in the output phase, so that it can avoid defects such as occurrence of dark lines during display on the display device comprising the shift register unit etc.

In the present disclosure, the "valid voltage signal" refers to a voltage signal capable of controlling a module which receives the valid voltage signal to be turned on, and the "invalid voltage signal" refers to a voltage signal capable of controlling a module which receives the invalid voltage signal to be turned off.

For example, for an N-type transistor, a high level signal is a valid voltage signal, and a low level signal is an invalid voltage signal; and for a P-type transistor, a low level signal is a valid voltage signal, and a high level signal is an invalid voltage signal.

In a specific implementation according to the present disclosure, all of the transistors in the shift register unit are N-type transistors, and therefore the valid voltage signal refers to a high level signal, and the invalid voltage signal refers to a low level signal.

It is to be understood by those skilled in the art that in the present disclosure, a clock signal input from the clock signal input terminal CK is a pulse signal in other phases than the touch phase, it should ensure that a valid clock signal (which can enable a thin film transistor on a gate line connected to the output terminal of the shift register unit to be turned on) is output from the clock signal input terminal CK in the output phase of the shift register unit, and the pull-up module 100 has a function of outputting the valid clock signal to the signal output terminal OUT as an output signal in the output phase. In the touch phase, the signal input from the clock signal input terminal CK is always an invalid voltage signal, so as not to affect the potential of the signal output terminal OUT.

Figure 2:
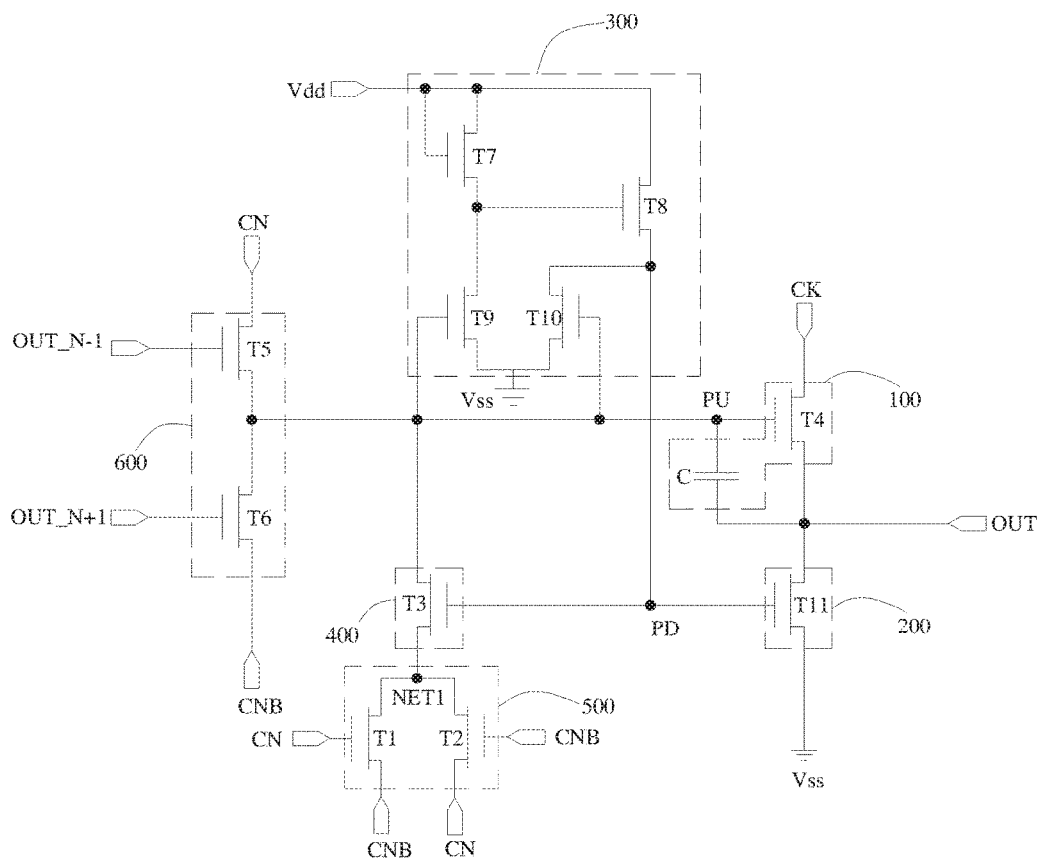
FIG. 2 is a diagram of a preferable implementation of a shift register unit according to the present disclosure.

In order to simplify a structure of the shift register unit, it is preferable that, as shown in FIG. 2, the discharge module 400 may comprise a discharge transistor T3 having a gate formed as the control terminal of the discharge module 400 and connected to the second node PD; a first electrode formed as the output terminal of the discharge module 400 and connected to the first node PU; and a second electrode formed as the input terminal of the discharge module 400 and connected to the output terminal of the current leakage suppression module 500. Accordingly, the current leakage suppression module 500 can supply an invalid voltage signal in other phases than the touch phase.

As described above, in the output pull-down phase t4, the second node PD is maintained at a level of a valid voltage signal, and thereby the discharge transistor T3 is turned on. Therefore, an invalid voltage signal output from the current leakage suppression module 500 can be transmitted to the first node PU through the discharge transistor T3, so that the potential of the first node PU can be pulled down to an invalid level in the output pull-down phase.

In the present disclosure, a specific structure of the current leakage suppression module 500 is not particularly limited, as long as a valid voltage signal can be supplied to the discharge module 400 in the touch phase without affecting other operation phases of the shift register unit.

As a preferable implementation of the present disclosure, as shown in FIG. 2, the current leakage suppression module 500 may comprise a first current leakage suppression transistor T1 having a gate connected to the first voltage terminal CN, a first electrode formed as the output terminal of the current leakage suppression module 500 and connected to the input terminal of the discharge module 400 (i.e., the second electrode of the discharge transistor T3), and a second electrode connected to the second voltage terminal CNB.

The current leakage suppression module 500 according to the present embodiment is applicable to a shift register unit which only performs a forward scan. A valid voltage signal is always supplied to the first voltage terminal CN, a valid voltage signal is supplied to the second voltage terminal CNB in the touch phase, and an invalid voltage signal is supplied to the second voltage terminal CNB in other phases. As the first voltage terminal CN supplies a valid voltage signal, the first current leakage suppression transistor T1 is always turned on during the forward scan. In each sub-phase of the display phase, an invalid voltage signal may be supplied to the input terminal of the discharge module 400, to ensure a normal operation of the shift register unit in the display phase. In the touch phase, a valid voltage signal may be supplied to the input terminal of the discharge module 400, to avoid current leakage of the first node PU.

In order to enable the shift register unit to be suitable for reverse scanning, it is preferable that the current leakage suppression module 500 may further comprise a second current leakage suppression transistor T2. As shown in FIG. 2, the second current leakage suppression transistor T2 has a gate connected to the second voltage terminal CNB, a first electrode connected to the input terminal of the discharge module 400, and a second electrode connected to the first voltage terminal CN.

It is to be noted that the voltage signal supplied to the first voltage terminal CN during the forward scan is different from the voltage signal supplied to the first voltage terminal CN during the reverse scan; and the voltage signal supplied to the second voltage terminal CNB during the forward scan is different from the voltage signal supplied to the second voltage terminal CNB during the reverse scan.

Specifically, during the forward scan, a valid voltage signal is always supplied to the first voltage terminal CN, a valid voltage signal is supplied to the second voltage terminal CNB in the touch phase, and an invalid voltage signal is supplied to the second voltage terminal CNB in other phases. During the reverse scan, a valid voltage signal is always supplied to the second voltage terminal CNB, a valid voltage signal is supplied to the first voltage terminal CN in the touch phase, and an invalid voltage signal is supplied to the first voltage terminal CN in other phases.

Therefore, during the forward scan, the first current leakage suppression transistor T1 is always turned on and the second current leakage suppression transistor T2 is always turned off. During the reverse scan, the first current leakage suppression transistor T1 is always turned off and the second current leakage suppression transistor T2 is always turned on. The operation principle of the current leakage suppression module 500 of the structure shown in FIG. 2 will be described later in detail below.

There is no special requirement on the specific structure of the pull-up module 100 in the present disclosure. In order to simplify the structure of the shift register unit, it is preferable that, as shown in FIG. 2, the pull-up module 100 comprises a pull-up transistor T4 and a storage capacitor C. The pull-up transistor T4 has a gate formed as the control terminal of the pull-up module 100 and connected to the first node PU, a first electrode formed as the input terminal of the pull-up module 100, and a second electrode formed as the output terminal of the pull-up module 100. The storage capacitor C has a first terminal connected to the first node PU, and a second terminal connected to the output terminal of the pull-up module 100.

When a valid voltage signal is supplied to the first node PU, the pull-up transistor T4 is turned on, and a clock signal input from the clock signal input terminal CK is an output signal from the signal output terminal OUT. When an invalid voltage signal is supplied to the first node PU, the pull-up transistor T4 is turned off. In the charge phase, the storage capacitor C may be charged, and in the touch phase, the storage capacitor C may maintain the first node PU in a valid level state.

Similarly, in the present disclosure, a specific structure of the pull-down module 200 is not particularly limited. In order to simplify the structure of the shift register unit, it is preferable that, as shown in FIG. 2, the pull-down module 200 comprises a pull-down transistor T11 having a gate formed as the control terminal of the pull-down module 200 and connected to the second node PD, a first electrode formed as the output terminal of the pull-down module 200, and a second electrode formed as the input terminal of the pull-down module 200.

When a valid voltage signal is supplied to the second node PD, the pull-down transistor T11 is turned on and a low level signal input from the second level input terminal Vss is output to the signal output terminal OUT, so that the signal output terminal OUT outputs an invalid voltage signal.

In the present disclosure, a specific structure of the pull-down control module 300 is also not particularly limited. For example, a preferable implementation of the pull-down control module 300 is shown in FIG. 2. As shown in FIG. 2, the pull-down control module 300 comprises a first control transistor T7, a second control transistor T8, a third control transistor T9, and a fourth control transistor T10. Specifically, the first control transistor T7 has a gate and a first electrode connected to the first level input terminal Vdd, and a second electrode connected to a gate of the second control transistor T8, the second control transistor T8 has a first electrode connected to the first level input terminal Vdd, and a second electrode formed as the control terminal of the pull-down control module 300 and connected to the second node PD, the third control transistor T9 has a gate formed as the output terminal of the pull-down control module 300 and connected to the first node PU, a first electrode connected to the second electrode of the first control transistor T7, and a second electrode connected to the second level input terminal Vss, and the fourth control transistor T10 has a gate connected to the first node PU, a first electrode connected to the second node PD, and a second electrode connected to the second level input terminal Vss.

In the present disclosure, a specific structure of the reset and input module 600 is also not limited, as long as it can charge the first node PU in the charge phase and discharge the first node PU in the output pull-down phase. In the preferable implementation shown in FIG. 2, the reset and input module 600 comprises a first reset and input transistor T5 and a second reset and input transistor T6. As shown, the first reset and input transistor T5 has a gate connected to the first signal input terminal OUT_N−1, a first electrode connected to the first voltage terminal CN, and a second electrode connected to the first node PU. The second reset and input transistor T6 has a gate connected to the second signal input terminal OUT_N+1, a first electrode connected to the first node PU, and a second electrode connected to the second voltage terminal CNB.

Here, the first voltage terminal CN and the second voltage terminal CNB are defined as in the above, that is, when the gate driving circuit comprising the shift register unit performs a forward scan, the signal input from the first voltage terminal CN is always a valid voltage signal, and the signal input from the second voltage terminal CNB is a valid voltage signal in the touch phase and is an invalid voltage signal in the remaining phases; and when the gate driving circuit comprising the shift register unit performs a reverse scan, the signal input from the first voltage terminal CN is a valid voltage signal in the touch phase and is an invalid voltage signal in the remaining phases, and the signal input from the second voltage terminal CNB is always a valid voltage signal.

The first signal input terminal OUT_N−1 is connected to an output terminal of a previous stage of shift register unit, and the second signal input terminal OUT_N+1 is connected to an output terminal of a next stage of shift register unit. During the forward scan, when the signal input from the first signal input terminal OUT_N−1 is a high level signal, the signal input from the second signal input terminal OUT_N+1 is a low level signal, the first reset and input transistor T5 is turned on, and the high level signal input from the first voltage terminal CN is transmitted to the first node PU through the first reset and input transistor T5.

During the reverse scan, when the signal input from the first signal input terminal OUT_N−1 is a low level signal, the signal input from the second signal input terminal OUT_N+1 is a high level signal, the second reset and input transistor T6 is turned on, and the high voltage signal input from the second voltage terminal CNB is transmitted to the first node PU through the second reset and input transistor T6.

An operation process of the shift register unit provided in FIG. 2 will be described below with reference to FIGS. 3 and 4. In the implementation shown in FIG. 2, each transistor is an N-type transistor, and therefore a high level signal is a valid voltage signal, and a low level signal is an invalid voltage signal.

FIG. 3 illustrates a timing diagram of various input signals during a forward scan. As can be seen in FIG. 3, an operating period of a shift register unit comprises a charge phase t1, a touch phase t2, an output phase t3, and an output pull-down phase t4.

In the charge phase t1, a high level input signal is input from the first signal input terminal OUT_N−1, a clock signal input from the clock signal input terminal CK is a low level signal, a signal input from the second signal input terminal OUT_N+1 is a low level signal, a high level signal is input from the first voltage terminal CN, and a low level signal is input from the second voltage terminal CNB. Therefore, the first reset and input transistor T5 is turned on, the second reset and input transistor T6 is turned off, and the high level signal input from the first voltage terminal CN charges the storage capacitor C. At the same time, in this phase, the first current leakage suppression transistor T1 is turned on and the second current leakage suppression transistor T2 is turned off, so as to transmit the low level signal to the second electrode of the discharge transistor T3. The first control transistor T7, the third control transistor T9, and the fourth control transistor T10 of the pull-down control module 300 are turned on. Due to voltage division by the first control transistor T7 and the third control transistor T9, the second control transistor T8 is turned off. The first node PU is at a high level, which causes the pull-up transistor T4 to be turned on, and as the clock signal is a low level signal, the output terminal OUT outputs a low level signal. The fourth control transistor T10 is turned on, so as to transmit the low level signal input from the second level input terminal Vss to the second node PD, so that the pull-down transistor T11 is turned off.

In the touch phase t2, the clock signal input from the clock signal input terminal CK is still a low level signal, the signal input from the first signal input terminal OUT_N−1 is at a low level, and the signal input from the second signal input terminal OUT_N+1 is also at a low level. Both the first reset and input transistor T5 and the second reset and input transistor T6 are turned off, and the first control transistor T7 is turned on. As the signal input from the second voltage terminal CNB in the touch phase is a high level signal, both the first current leakage suppression transistor T1 and the second current leakage suppression transistor T2 are turned on and the high level signal is transmitted to the discharge transistor T3, so that it can ensure that current leakage does not occur to the first node PU through the discharge transistor T3. As the first node PU is at a high level, the third control transistor T9 is turned on. Due to voltage division by the first control transistor T7 and the third control transistor T9, the second control transistor T8 is turned off. The fourth control transistor T10 is turned on, so as to cause the second node PD to be continuously maintained in a low level state. In the touch phase, the clock signal is a low level signal, and therefore the OUT outputs a low level signal. In the touch phase, touch driving signal lines are scanned by the touch driving circuit. In the implementation illustrated in FIG. 3, touch driving signal lines Tx1, Tx2, Tx3 and Tx4 are shown.

In the output phase t3, the clock signal transitions to a high level signal, the signal input from the first voltage terminal CN is a high level signal, the signal input from the second voltage terminal CNB is a low level signal, the signal input from the first signal input terminal OUT_N−1 is at a low level, and the signal input from the second signal input terminal OUT_N+1 is also at a low level. Both the first reset and input transistor T5 and the second reset and input transistor T6 are turned off, and the first control transistor T7 is turned on. Therefore, the potential of the first node PU transitions to a higher potential under a bootstrapping function of the storage capacitor C, and thereby the pull-up transistor T4 is turned on, so that the output terminal OUT outputs a high level signal. In this phase, the first current leakage suppression transistor T1 is turned on and the second current leakage suppression transistor T2 is turned off. Thereby, the second electrode of the discharge transistor T3 is at a low level voltage. Similarly, the third control transistor T9 is turned on, which causes the third control transistor T9 and the first control transistor T7 to have a voltage division function, so that the second control transistor T8 is turned off. The fourth control transistor T10 is turned on, to maintain a low level state of the second node PD, thereby ensuring that the pull-down transistor T11 is turned off.

In the output pull-down phase t4, the clock signal transitions to a low level signal, the signal input from the first voltage terminal CN is a high level signal, the signal input from the second voltage terminal CNB is a low level signal, the signal input from the first signal input terminal OUT_N−1 is at a low level, and the signal input from the second signal input terminal OUT_N+1 is a high level signal. Therefore, the second reset and input transistor T6 is turned on, and the potential of the first node PU is pulled down by the low level signal input from the second voltage terminal CNB. The first current leakage suppression transistor T1 is turned on and the second current leakage suppression transistor T2 is turned off, so that the second electrode of the discharge transistor T3 is at a low level voltage. As the potential of the first node PU is pulled down, both the third control transistor T9 and the fourth control transistor T10 are turned off. The first control transistor T7 is turned on, which causes the second control transistor T8 to be also turned on, so that the potential of the second node PD is pulled up to a high level. The discharge transistor T3 is turned on, which causes the first node PU to be further pulled down and causes the pull-down transistor T11 to be turned on, so that the signal output terminal OUT is pulled down to a low level. At this point, an operating period of a shift register unit ends.

Figure 4:
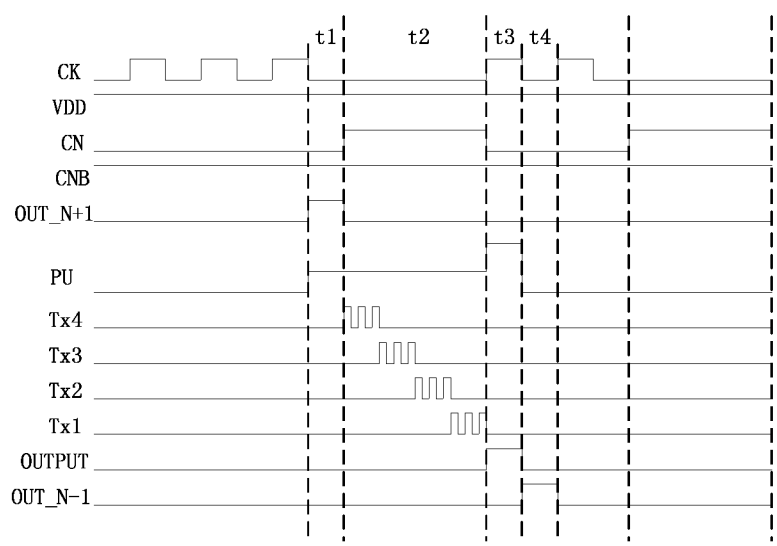
FIG. 4 is a timing diagram of signals during a reverse scan of the shift register unit provided in FIG. 2.

FIG. 4 illustrates a timing diagram of various input signals during a reverse scan. As can be seen in FIG. 4, an operating period of a shift register unit comprises a charge phase t1, a touch phase t2, an output phase t3, and an output pull-down phase t4.

In the charge phase t1, a high level input signal is input from the second signal input terminal OUT_N+1, a clock signal input from the clock signal input terminal CK is a low level signal, a signal input from the first signal input terminal OUT_N−1 is a low level signal, a low level signal is input from the first voltage terminal CN, and a high level signal is input from the second voltage terminal CNB. Therefore, the first reset and input transistor T5 is turned off, the second reset and input transistor T6 is turned on, and the high level signal input from the second voltage terminal CNB charges the storage capacitor C. At the same time, in this phase, the second current leakage suppression transistor T2 is turned on and the first current leakage suppression transistor T1 is turned off, so as to transmit the low level signal to the second electrode of the discharge transistor T3. The first control transistor T7, the third control transistor T9, and the fourth control transistor T10 of the pull-down control module 300 are turned on. Due to voltage division by the first control transistor T7 and the third control transistor T9, the second control transistor T8 is turned off. The first node PU is at a high level, which causes the pull-up transistor T4 to be turned on, and as the clock signal is a low level signal, the output terminal OUT outputs a low level signal. The fourth control transistor T10 is turned on, so as to transmit the low level signal input from the second level input terminal Vss to the second node PD, so that the pull-down transistor T11 is turned off.

In the touch phase t2, the clock signal input from the clock signal input terminal CK is still a low level signal, the signal input from the first signal input terminal OUT_N−1 is at a low level, and the signal input from the second signal input terminal OUT_N+1 is also at a low level. Both the first reset and input transistor T5 and the second reset and input transistor T6 are turned off, and the first control transistor T7 is turned on. As the signal input from the first voltage terminal CN in the touch phase is a high level signal, both the first current leakage suppression transistor T1 and the second current leakage suppression transistor T2 are turned on and the high level signal is transmitted to the second electrode of the discharge transistor T3, so that it can ensure that current leakage does not occur to the first node PU through the discharge transistor T3. As the first node PU is at a high level, the third control transistor T9 is turned on. Due to voltage division by the first control transistor T7 and the third control transistor T9, the second control transistor T8 is turned off. The fourth control transistor T10 is turned on, so as to cause the second node PD to be continuously maintained in a low level state. In the touch phase, the clock signal is a low level signal, and therefore the output terminal OUT outputs a low level signal. In the touch phase, touch driving signal lines are scanned by the touch driving circuit. In the implementation illustrated in FIG. 3, touch driving signal lines Tx1, Tx2, Tx3 and Tx4 are shown.

In the output phase t3, the clock signal transitions to a high level signal, the signal input from the first voltage terminal CN is a low level signal, the signal input from the second voltage terminal CNB is a high level signal, the signal input from the first signal input terminal OUT_N−1 is at a low level, and the signal input from the second signal input terminal OUT_N+1 is also at a low level. Both the first reset and input transistor T5 and the second reset and input transistor T6 are turned off, and the first control transistor T7 is turned on. Therefore, the potential of the first node PU transitions to a higher potential under a bootstrapping function of the storage capacitor C, and thereby the pull-up transistor T4 is turned on, so that the output terminal OUT outputs a high level signal. In this phase, the first current leakage suppression transistor T1 is turned off and the second current leakage suppression transistor T2 is turned on. Thereby, the second electrode of the discharge transistor T3 is at a low level voltage. Similarly, the third control transistor T9 is turned on, which causes the third control transistor T9 and the first control transistor T7 to have a voltage division function, so that the second control transistor T8 is turned off. The fourth control transistor T10 is turned on, to maintain a low level state of the second node PD, thereby ensuring that the pull-down transistor T11 is turned off.

In the output pull-down phase t4, the clock signal transitions to a low level signal, the signal input from the first voltage terminal CN is a low level signal, the signal input from the second voltage terminal CNB is a high level signal, the signal input from the first signal input terminal OUT_N−1 is at a high level, and the signal input from the second signal input terminal OUT_N+1 is a low level signal. Therefore, the first reset and input transistor T5 is turned on, and the potential of the first node PU is pulled down by the low level signal input from the first voltage terminal CN. The first current leakage suppression transistor T1 is turned off and the second current leakage suppression transistor T2 is turned on, so that the second electrode of the discharge transistor T3 is at a low level voltage. As the potential of the first node PU is pulled down, both the third control transistor T9 and the fourth control transistor T10 are turned off. The first control transistor T7 is turned on, which causes the second control transistor T8 to be also turned on, so that the potential of the second node PD is pulled up to a high level. The discharge transistor T3 is turned on, which causes the first node PU to be further pulled down and causes the pull-down transistor T11 to be turned on, so that the signal output terminal OUT is pulled down to a low level. At this point, an operating period of a shift register unit ends.

In another aspect of the present disclosure, there is provided a gate driving circuit, comprising multiple cascaded stages of shift register units, wherein an operating period of the gate driving circuit comprises alternate display phases and touch phases, and the multiple stages of shift register units are divided into a plurality of groups, each of which comprises N shift register units and corresponds to a display phase, wherein at least starting from a second group of shift register units, at least a first stage of shift register unit in each of the groups of shift register units is the shift register unit according to the present disclosure.

Figure 5:
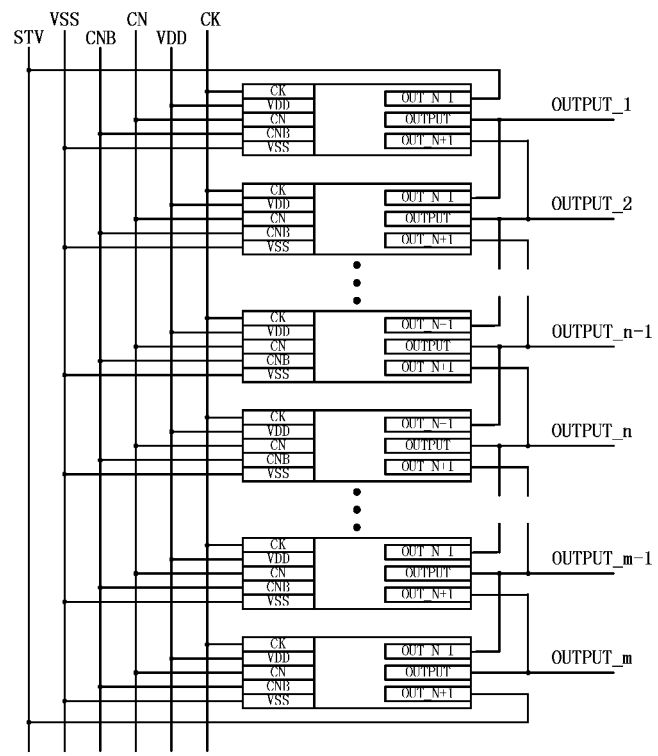
FIG. 5 is a diagram of a gate driving circuit according to the present disclosure.

FIG. 5 illustrates a preferable implementation of a gate driving circuit according to the present disclosure. It is easy to understand that when the multiple stages of shift register units are cascaded, an output signal of a previous stage of shift register unit is an input signal of a next stage of shift register unit.

It is easy to understand that the gate driving circuit further comprises a clock signal line, a high level signal line, a start signal line STV, a low level signal line, a first level signal line and a second level signal. The clock signal line is connected to a clock signal input terminal of each stage of shift register unit, the high level signal line is connected to a first level input terminal of each stage of shift register unit, the start signal line STV is selectively connected to a forward signal input terminal of a first stage of shift register unit (during a forward scan) and a reverse signal input terminal of a last stage of shift register unit (during a reverse scan), the first level signal line is connected to a first level input terminal of each stage of shift register unit, the second level signal line is connected to a second level input terminal of each stage of shift register unit, and the low level signal line is connected to a second level input terminal of each stage of shift register unit.

Starting from a second group of shift register units, a first stage of shift register unit in each group of shift register units is charged before the touch phase, and starts to output after the touch phase. As the first stage of shift register unit comprises a current leakage suppression module, in the entire touch phase, current leakage does not occur to a first node of the first stage of shift register unit, which can ensure that a stable scan signal is output after the touch phase, thereby avoiding occurrence of dark lines.

In the present disclosure, a number of the shift register units according to the present disclosure which are provided in the gate driving circuit is not particularly limited. For example, the number of the shift register units according to the present disclosure which are provided in the gate driving circuit may be a number of groups of shift register units minus 1.

In the present disclosure, a specific value of N is not particularly defined, and in an implementation of the present disclosure, N is 4.

For example, if the gate driving circuit comprises four groups of shift register units, the gate driving circuit may comprise three shift register units each having a current leakage suppression module. The three shift register units each having a current leakage suppression module are a first stage of shift register unit in a second group of shift register units, a first stage of shift register unit in a third group of shift register units, and a first stage of shift register unit in a fourth group of shift register units respectively.

For ease of manufacturing, it is preferable that each shift register unit is the above-described shift register unit according to the present disclosure.

In FIG. 5, m stages of shift register units are shown, which are connected to m gate lines of the display device respectively. OUTPUT_1 represents a first gate line, OUTPUT_2 represents a second gate line, OUTPUT_n−1 represents an n−1$^{th}$ gate line, OUTPUT_m−1 represents an m−1$^{th}$ gate line, and OUTPUT_m represents an m$^{th}$ gate line.

Figure 6:
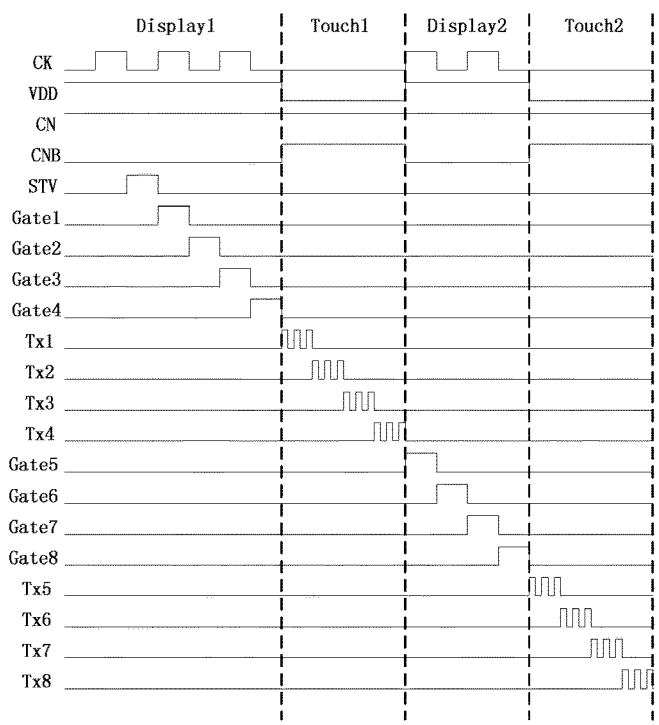
FIG. 6 is a timing diagram of signals during a forward scan of a gate driving circuit according to the present disclosure.
Figure 7:
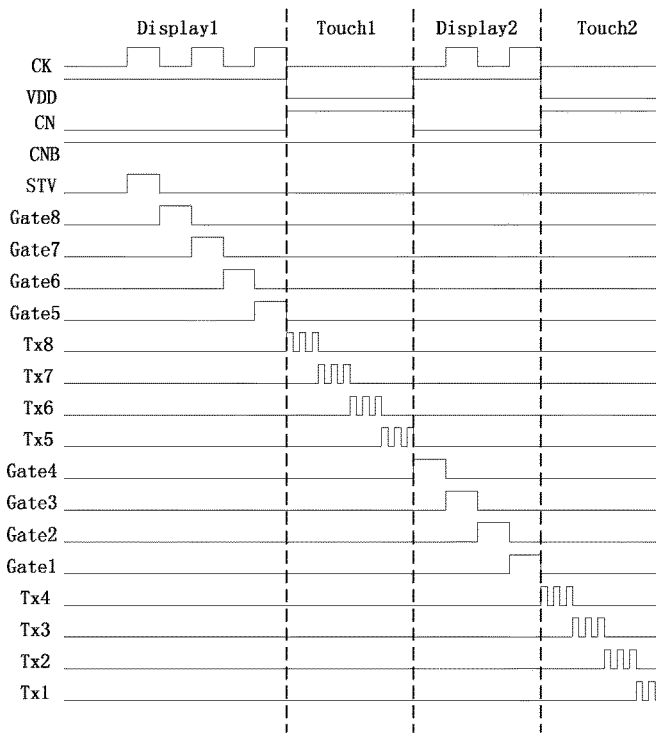
FIG. 7 is a timing diagram of signals during a reverse scan of a gate driving circuit according to the present disclosure.

FIG. 6 is a timing diagram of various signals in an operation of the gate driving circuit according to the present disclosure. FIG. 7 is a timing diagram of various signals in an operation of the gate driving circuit according to the present disclosure.

In FIGS. 6 and 7, Gate1, Gate2, Gate3, Gate4, Gate5, Gate6, Gate7 and Gate8 represent a first gate line, a second gate line, a third gate line, a fourth gate line, a fifth gate line, a sixth grid line, a seventh gate line and an eighth gate line respectively. Tx1, Tx2, Tx3, Tx4, Tx5, Tx6, Tx7 and Tx8 represent a first touch scan line, a second touch scan line, a third touch scan line, a fourth touch scan line, a fifth touch scan line, a sixth touch scan line, a seventh touch scan line and an eighth touch scan line respectively.

In FIG. 6, each group of shift register units comprises four shift register units. Shift register units corresponding to the first gate line Gate1, the second gate line Gate2, the third gate line Gate3 and the fourth gate line Gate4 belong to the same group, and output a scan signal in turn in a display phase Display1; and shift register units corresponding to the fifth gate line Gate5, the sixth gate line Gate6, the seventh gate line Gate7 and the eighth gate line Gate8 belong to the same group, and output a scan signal in turn in a display phase Display2. At least the shift register unit corresponding to the fifth gate line Gate5 is the shift register unit comprising a current leakage suppression module according to the present disclosure.

As in FIG. 6, in FIG. 7, each group of shift register units comprises four shift register units. Shift register units corresponding to the first gate line Gate1, the second gate line Gate2, the third gate line Gate3 and the fourth gate line Gate4 belong to the same group, and output a scan signal in turn in a display phase Display2; and shift register units corresponding to the fifth gate line Gate5, the sixth gate line Gate6, the seventh gate line Gate7 and the eighth gate line Gate8 belong to the same group, and output a scan signal in turn in a display phase Display1. Differently from FIG. 6, at least the shift register unit corresponding to the fourth gate line Gate4 is the shift register unit comprising a current leakage suppression module according to the present disclosure.

In another aspect of the present disclosure, there is provided a touch display device comprising a gate driving circuit and a touch driving circuit, wherein the gate driving circuit is the gate driving circuit according to the present disclosure, and a plurality of output terminals of the touch driving circuit are divided into a plurality of groups, each of which comprises M output terminals and corresponds to a touch phase.

In the present disclosure, values of M and N may be the same or different. In specific implementations illustrated in FIGS. 6 and 7, both M and N are 4.

In the implementations illustrated in FIGS. 6 and 7, four output terminals respectively corresponding to the first touch scan line Tx1, the second touch scan line Tx2, the third touch scan line Tx3 and the fourth touch scan line Tx4 are a group, and four output terminals respectively corresponding to the fifth touch scan line Tx5, the sixth touch scan line Tx6, the seventh touch scan line Tx7 and the eighth touch scan line Tx8 are a group. In a touch phase Touch1, the four output terminals corresponding to the first touch scan line Tx1, the second touch scan line Tx2, the third touch scan line Tx3 and the fourth touch scan line Tx4 output four touch scan signals respectively, and in a touch phase Touch2, the four output terminals corresponding to the fifth touch scan line Tx5, the sixth touch scan line Tx6, the seventh touch scan line Tx7 and the eighth touch scan line Tx8 output four touch scan signals respectively.

In another aspect of the present disclosure, there is provided a method for driving a shift register unit, wherein the shift register unit is the shift register unit according to the present disclosure, When a forward scan is performed, the method comprising, in each driving period:

in a charge phase, a valid voltage signal is supplied to the first signal input terminal, an invalid voltage signal is supplied to the second signal input terminal, a valid voltage signal is supplied to the first voltage terminal, an invalid voltage signal is supplied to the second voltage terminal, and an invalid voltage signal is supplied to the clock signal input terminal;

in a touch phase, an invalid voltage signal is supplied to the first signal input terminal, an invalid voltage signal is supplied to the second signal input terminal, a valid voltage signal is supplied to the first voltage terminal, a valid voltage signal is supplied to the second voltage terminal, and an invalid voltage signal is supplied to the clock signal input terminal;

in an output phase, an invalid voltage signal is supplied to the first signal input terminal, an invalid voltage signal is supplied to the second signal input terminal, a valid voltage signal is supplied to the first voltage terminal, an invalid voltage signal is supplied to the second voltage terminal, and a valid voltage signal is supplied to the clock signal input terminal; and in an output pull-down phase, a valid voltage signal is supplied to the second signal input terminal, an invalid voltage signal is supplied to the first signal input terminal, a valid voltage signal is supplied to the first voltage terminal, an invalid voltage signal is supplied to the second voltage terminal, and an invalid voltage signal is supplied to the clock signal input terminal.

When a reverse scan is performed, the method comprising, in each driving period:

in a charge phase, an invalid voltage signal is supplied to the first signal input terminal, a valid voltage signal is supplied to the second signal input terminal, an invalid voltage signal is supplied to the first voltage terminal, a valid voltage signal is supplied to the second voltage terminal, and an invalid voltage signal is supplied to the clock signal input terminal;

in a touch phase, an invalid voltage signal is supplied to the first signal input terminal, an invalid voltage signal is supplied to the second signal input terminal, a valid voltage signal is supplied to the first voltage terminal, a valid voltage signal is supplied to the second voltage terminal, and an invalid voltage signal is supplied to the clock signal input terminal;

in an output phase, an invalid voltage signal is supplied to the first signal input terminal, an invalid voltage signal is supplied to the second signal input terminal, an invalid voltage signal is supplied to the first voltage terminal, a valid voltage signal is supplied to the second voltage terminal, and a valid voltage signal is supplied to the clock signal input terminal; and in an output pull-down phase, a valid voltage signal is supplied to the first signal input terminal, an invalid voltage signal is supplied to the second signal input terminal, an invalid voltage signal is supplied to the first voltage terminal, a valid voltage signal is supplied to the second voltage terminal, and an invalid voltage signal is supplied to the clock signal input terminal.

The principles and advantageous effects of driving the display device using the driving method have been explained in detail above, and will not be described here.

It can be understood that the above implementations are merely exemplary implementations for explaining the principle of the present disclosure, but the present disclosure is not limited thereto. It will be apparent to those skilled in the art that various changes and modifications can be made without departing from the spirit and essence of the disclosure, and all these changes and modifications are also construed to be within the protection scope of the present disclosure.

We claim:

1. A shift register unit applied in a touch display device, comprising: a first signal input terminal, a second signal input terminal, an input and reset module, a pull-up module, a pull-down module, a pull-down control module, a clock signal input terminal, a first level input terminal, a second level input terminal, a first voltage terminal, a second voltage terminal, a signal output terminal, a discharge module and a current leakage suppression module, wherein the input and reset module has a first control terminal connected to the first signal input terminal, a second control terminal connected to the second signal input terminal, a first input terminal connected to the first voltage terminal, a second input terminal connected to the second voltage terminal, and an output terminal connected to a first node, wherein in a condition that the first signal input terminal receives a valid voltage signal and the second signal input terminal receives an invalid voltage signal, a connection between the first voltage terminal and the output terminal of the input and reset module is turned on, and in a condition that the first signal input terminal receives an invalid voltage signal and the second signal input terminal receives a valid voltage signal, a connection between the second voltage terminal and the output terminal of the input and reset module is turned on;

the pull-up module has an input terminal connected to the clock signal input terminal, an output terminal connected to the signal output terminal, and a control terminal connected to the first node, wherein in a condition that the control terminal of the pull-up module receives a valid voltage signal from the first node, a connection between the input terminal of the pull-up module and the signal output terminal is turned on;

the pull-down module has an input terminal connected to the second level input terminal, an output terminal connected to the signal output terminal, and a control terminal connected to a second node, wherein in a condition that the control terminal of the pull-down module receives a valid voltage signal from the second node, a connection between the input terminal of the pull-down module and the output terminal of the pull-down module is turned on;

the pull-down control module has a control terminal connected to the first node, an output terminal connected to the second node, a first input terminal connected to the first level input terminal, and a second input terminal connected to the second level input terminal, wherein in a condition that the control terminal of the pull-down control module receives a valid voltage signal, a connection between the second level input terminal and the output terminal of the pull-down control module is turned on, and in a condition that the control terminal of the pull-down control module receives an invalid voltage signal, a connection between the first level input terminal and the output terminal of the pull-down control module is turned on;

the discharge module has an output terminal connected to the first node, a control terminal connected to the second node, and an input terminal connected to an output terminal of the current leakage suppression module, wherein in a condition that the control terminal of the discharge module receives a valid voltage signal, a connection between the input terminal of the discharge module and the output terminal of the discharge module is turned on; and the current leakage suppression module has a first terminal connected to the first voltage terminal and a second terminal connected to the second voltage terminal.

2. The shift register unit according to claim 1, wherein the discharge module comprises a discharge transistor having a gate formed as the control terminal of the discharge module, a first electrode formed as the output terminal of the discharge module, and a second electrode formed as the input terminal of the discharge module.

3. The shift register unit according to claim 1, wherein the current leakage suppression module comprises a first current leakage suppression transistor having a gate connected to the first voltage terminal, a first electrode formed as the output terminal of the current leakage suppression module, and a second electrode connected to the second voltage terminal.

4. The shift register unit according to claim 3, wherein the current leakage suppression module further comprises a second current leakage suppression transistor having a gate connected to the second voltage terminal, a first electrode connected to the input terminal of the discharge module, and a second electrode connected to the first voltage terminal.

5. The shift register unit according to claim 1, wherein the pull-up module comprises a pull-up transistor and a storage capacitor, wherein the pull-up transistor has a gate formed as the control terminal of the pull-up module, a first electrode formed as the input terminal of the pull-up module, and a second electrode formed as the output terminal of the pull-up module, and the storage capacitor has a first terminal connected to the first node, and a second terminal connected to the output terminal of the pull-up module.

6. The shift register unit according to claim 1, wherein the pull-down module comprises a pull-down transistor having a gate formed as the control terminal of the pull-down module, a first electrode formed as the output terminal of the pull-down module, and a second electrode formed as the input terminal of the pull-down module.

7. The shift register unit according to claim 1, wherein the pull-down control module comprises a first control transistor, a second control transistor, a third control transistor and a fourth control transistor, wherein the first control transistor has a gate and a first electrode connected to the first level input terminal, and a second electrode connected to a gate of the second control transistor, the second control transistor has a first electrode connected to the first level input terminal, and a second electrode formed as the control terminal of the pull-down control module, the third control transistor has a gate formed as the output terminal of the pull-down control module, a first electrode connected to the second electrode of the first control transistor, and a second electrode connected to the second level input terminal, and the fourth control transistor has a gate connected to the first node, a first electrode connected to the second node, and a second electrode connected to the second level input terminal.

8. The shift register unit according to claim 7, wherein the reset and input module comprises a first reset and input transistor and a second reset and input transistor, wherein the first reset and input transistor has a gate connected to the first signal input terminal, a first electrode connected to the first voltage terminal, and a second electrode connected to the first node, and the second reset and input transistor has a gate connected to the second signal input terminal, a first electrode connected to the first node, and a second electrode connected to the second voltage terminal.

9. A gate driving circuit, comprising multiple stages of shift register units, wherein an operating period of the gate driving circuit comprises alternate display phases and touch phases, and the multiple stages of shift register units are divided into a plurality of groups, each of which comprises N shift register units and corresponds to one of the display phases, where N is a natural number, wherein in at least one group among groups from a second group to a last group, at least a first stage of shift register unit in each group is the shift register unit according to claim 1.

10. A touch display device comprising a gate driving circuit and a touch driving circuit including a plurality of output terminals, wherein the gate driving circuit is the gate driving circuit according to claim 9, and the plurality of output terminals of the touch driving circuit are divided into a plurality of groups, each of which comprises M output terminals and corresponds to one of the touch phases, where M is a natural number.

11. A method for driving the shift register unit according to claim 1, wherein performing a forward scan comprises, in each driving period:
   in a charge phase, supplying a valid voltage signal to the first signal input terminal, supplying an invalid voltage signal to the second signal input terminal, supplying a valid voltage signal to the first voltage terminal, supplying an invalid voltage signal to the second voltage terminal, and supplying an invalid voltage signal to the clock signal input terminal;
   in a touch phase, supplying an invalid voltage signal to the first signal input terminal, supplying an invalid voltage signal to the second signal input terminal, supplying a valid voltage signal to the first voltage terminal, supplying a valid voltage signal to the second voltage terminal, and supplying an invalid voltage signal to the clock signal input terminal;
   in an output phase, supplying an invalid voltage signal to the first signal input terminal, supplying an invalid voltage signal to the second signal input terminal, supplying a valid voltage signal to the first voltage terminal, supplying an invalid voltage signal to the second voltage terminal, and supplying a valid voltage signal to the clock signal input terminal; and
   in an output pull-down phase, supplying a valid voltage signal to the second signal input terminal, supplying an invalid voltage signal to the first signal input terminal, supplying a valid voltage signal to the first voltage terminal, supplying an invalid voltage signal to the second voltage terminal, and supplying an invalid voltage signal to the clock signal input terminal; and
wherein performing a reverse scan comprises, in each driving period:
   in a charge phase, supplying an invalid voltage signal to the first signal input terminal, supplying a valid voltage signal to the second signal input terminal, supplying an invalid voltage signal to the first voltage terminal, supplying a valid voltage signal to the second voltage terminal, and supplying an invalid voltage signal to the clock signal input terminal;
   in a touch phase, supplying an invalid voltage signal to the first signal input terminal, supplying an invalid voltage signal to the second signal input terminal, supplying a valid voltage signal to the first voltage terminal, supplying a valid voltage signal to the second voltage terminal, and supplying an invalid voltage signal to the clock signal input terminal;
   in an output phase, supplying an invalid voltage signal to the first signal input terminal, supplying an invalid voltage signal to the second signal input terminal, supplying an invalid voltage signal to the first voltage terminal, supplying a valid voltage signal to the second voltage terminal, and supplying a valid voltage signal to the clock signal input terminal; and
   in an output pull-down phase, supplying a valid voltage signal to the first signal input terminal, supplying an invalid voltage signal to the second signal input terminal, supplying an invalid voltage signal to the first voltage terminal, supplying a valid voltage signal to the second voltage terminal, and supplying an invalid voltage signal to the clock signal input terminal.

12. The shift register unit according to claim 2, wherein the current leakage suppression module comprises a first current leakage suppression transistor having a gate connected to the first voltage terminal, a first electrode formed as the output terminal of the current leakage suppression module, and a second electrode connected to the second voltage terminal.

13. The shift register unit according to claim 12 wherein the current leakage suppression module further comprises a second current leakage suppression transistor having a gate connected to the second voltage terminal, a first electrode connected to the input terminal of the discharge module, and a second electrode connected to the first voltage terminal.

14. A gate driving circuit, comprising multiple stages of shift register units, wherein an operating period of the gate driving circuit comprises alternate display phases and touch phases, and the multiple stages of shift register units are divided into a plurality of groups, each of which comprises N shift register units and corresponds to one of the display phases, where N is a natural number, wherein in at least one group among groups from a second group to a last group, at least a first stage of shift register unit in each group is the shift register unit according to claim 2.

15. A gate driving circuit, comprising multiple stages of shift register units, wherein an operating period of the gate driving circuit comprises alternate display phases and touch phases, and the multiple stages of shift register units are divided into a plurality of groups, each of which comprises N shift register units and corresponds to one of the display phases, where N is a natural number, wherein in at least one group among groups from a second group to a last group, at least a first stage of shift register unit in each group is the shift register unit according to claim 12.

16. A gate driving circuit, comprising multiple stages of shift register units, wherein an operating period of the gate driving circuit comprises alternate display phases and touch phases, and the multiple stages of shift register units are divided into a plurality of groups, each of which comprises N shift register units and corresponds to one of the display phases, where N is a natural number, wherein in at least one group among groups from a second group to a last group, at least a first stage of shift register unit in each group is the shift register unit according to claim 4.

17. A touch display device comprising a gate driving circuit and a touch driving circuit including a plurality of output terminals, wherein the gate driving circuit is the gate driving circuit according to claim 14, and the plurality of output terminals of the touch driving circuit are divided into a plurality of groups, each of which comprises M output terminals and corresponds to one of the touch phases, where M is a natural number.

18. A touch display device comprising a gate driving circuit and a touch driving circuit including a plurality of output terminals, wherein the gate driving circuit is the gate driving circuit according to claim 15, and the plurality of output terminals of the touch driving circuit are divided into a plurality of groups, each of which comprises M output terminals and corresponds to one of the touch phases, where M is a natural number.

19. A touch display device comprising a gate driving circuit and a touch driving circuit including a plurality of output terminals, wherein the gate driving circuit is the gate driving circuit according to claim 16, and the plurality of output terminals of the touch driving circuit are divided into a plurality of groups, each of which comprises M output terminals and corresponds to one of the touch phases, where M is a natural number.

20. A gate driving circuit, comprising multiple stages of shift register units, wherein an operating period of the gate driving circuit comprises alternate display phases and touch phases, and the multiple stages of shift register units are divided into a plurality of groups, each of which comprises N shift register units and corresponds to one of the display phases, where N is a natural number, wherein in at least one group among groups from a second group to a last group, at least a first stage of shift register unit in each group is the shift register unit according to claim 7.

* * * * *